United States Patent
Lin et al.

(10) Patent No.: US 8,121,572 B2
(45) Date of Patent: Feb. 21, 2012

(54) SIGNAL STRENGTH DETECTING DEVICE AND RELATED METHOD

(75) Inventors: Ying-Yao Lin, Hsin-Chu (TW); Ren-Chieh Liu, Hsin-Chu (TW)

(73) Assignee: PixArt Imaging Inc., Hsin-Chu (TW)

( * ) Notice: Subject to any disclaimer, the term of this patent is extended or adjusted under 35 U.S.C. 154(b) by 55 days.

(21) Appl. No.: 12/842,054

(22) Filed: Jul. 23, 2010

(65) Prior Publication Data

US 2011/0223878 A1  Sep. 15, 2011

(30) Foreign Application Priority Data

Mar. 10, 2010 (TW) .............................. 99106944 A (51) Int. Cl.
*H04B 1/16* (2006.01)
(52) U.S. Cl. ...................................... 455/232.1; 455/323
(58) Field of Classification Search ................ 455/226.1, 455/226.2, 226.3, 232.1, 234.1, 234.2, 241.1, 455/245.2, 250.1, 323, 324, 334
See application file for complete search history.

(56) References Cited

U.S. PATENT DOCUMENTS

| | | | |
|---|---|---|---|
| 5,187,809 A * | 2/1993 | Rich et al. | 455/234.2 |
| 6,169,761 B1 * | 1/2001 | Marcoccia et al. | 375/132 |
| 6,718,165 B1 * | 4/2004 | Ha | 455/234.2 |
| 7,212,798 B1 | 5/2007 | Adams et al. | |
| 7,542,731 B2 * | 6/2009 | Park et al. | 455/84 |
| 2008/0139161 A1 * | 6/2008 | Park et al. | 455/323 |
| 2009/0298454 A1 * | 12/2009 | Ikeda et al. | 455/234.1 |
| 2010/0022199 A1 * | 1/2010 | Cole et al. | 455/77 |
| 2011/0039509 A1 * | 2/2011 | Bruchner | 455/232.1 |

* cited by examiner

Primary Examiner — Blane J Jackson
(74) Attorney, Agent, or Firm — Winston Hsu; Scott Margo (57) ABSTRACT

A signal strength detecting device of a communication system is disclosed. The signal strength detecting device is coupled to a frequency down mixer of the communication system and the frequency down mixer is used for receiving and converting a first signal to a second signal whose frequencies are lower than frequencies of the first signal. The signal strength detecting device comprises a frequency up converter for receiving and converting the second signal to a third signal whose frequencies are higher than the frequencies of the second signal and a detecting unit for detecting strength of the third signal and generating a signal strength indicator to the communication system according to a detecting result corresponding to the strength of the third signal, wherein the signal strength indicator represents the strength of the first signal received by the frequency down mixer.

22 Claims, 7 Drawing Sheets

SIGNAL STRENGTH DETECTING DEVICE AND RELATED METHOD

BACKGROUND OF THE INVENTION

1. Field of the Invention

The present invention relates to a signal detecting device and related method, more particularly, to a device of a communication system for detecting signal strength and related method.

2. Description of the Prior Art

Generally, the automatic gain control (AGC) has been used in a radio frequency (RF) receiver to adjust strength of received signals at the analog front-end so that the received signals do not suffer much distortion at a stage of converting into back-end digital signals. Before adjusting gains, the receiver must measure the strength of received signals in order to get the appropriate range for signal adjustment.

The RF receiver normally includes one or several amplifiers with variable gains and analog to digital converters with a range of linear transformation. The RF receiver adjusts amplifier gains according to strength of detected signals to maintain the signals received by analog to digital converters within the range of the transformation to avoid distortion.

The typical method of signal strength detection is to detect strength of signals whose frequencies have been downed to an intermediate frequency band or near baseband frequency band and then to adjust corresponding amplifier gains according to the detected strengths. U.S. Pat. No. 7,212,798 discloses, in FIG. 2, a signal strength detecting device detecting strengths of the received signals at three stages from the intermediate to low frequency stages in the signal receiving path, i.e. the analog RSSI detectors 227 and 217 and the digital measuring logic circuit 231. However, detecting signal strength at the low frequency (e.g. 200 KHz) requires long signal settling time and ripple effect is more severe in the low frequency signals. In addition, the signal strength detecting device usually demands capacitors with larger capacitance to reduce ripples, thereby occupying larger circuit area.

SUMMARY OF THE INVENTION

It is therefore an objective of the present invention to provide a signal strength detecting device and related methods in order to increase efficiency and accuracy of strength detection and also to reduce the circuit area.

The present invention mainly decreases frequencies of a received signal of a communication system, raises the frequencies and then executes the strength detection for the received signal.

The present invention discloses a signal strength detecting device of a communication system. The signal strength detecting device is coupled to a frequency down mixer of the communication system is disclosed. The frequency down mixer is used for receiving and converting a first signal to a second signal whose frequencies are lower than frequencies of the first signal. The signal strength detecting device comprises a frequency up converter for receiving and converting the second signal to a third signal whose frequencies are higher than the frequencies of the second signal and a detecting unit for detecting strength of the third signal and generating a signal strength indicator to the communication system according to a detecting result corresponding to the strength of the third signal, wherein the signal strength indicator represents the strength of the first signal received by the frequency down mixer.

The present invention further discloses a signal strength detecting method for a signal strength detecting device of a communication system. The signal strength detecting device is coupled to a frequency down mixer for receiving and converting a first signal to a second signal whose frequencies are lower than frequencies of the first signal. The signal strength detection method comprises receiving and converting the second signal to a third signal whose frequencies are higher than frequencies of the second signal, detecting strength of the third signal and generating a signal strength indicator to the communication system according to a detecting result corresponding to the strength of the third signal, wherein the signal strength indicator represents strength of the first signal received by the frequency down mixer.

The present invention further discloses a communication system comprising a signal reception circuit and a signal transmission circuit. The communication system comprises a frequency down mixer installed in the signal transmission circuit, for receiving and converting a first signal to a second signal whose frequencies are lower than frequencies of the first signal and a frequency up mixer installed in the signal transmission circuit and coupled to the frequency down mixer, for receiving and converting the second signal to a third signal whose frequencies are higher than frequencies of the second signal when the communication system does not transmit any signal and a detecting unit coupled to the frequency up mixer, for detecting strength of the third signal and generating a signal strength indicator according to a detecting result corresponding to the strength of the third signal, wherein the signal strength indicator represents a strength of the first signal received from the frequency down mixer.

The present invention further discloses a signal strength detecting method for a communication system. The signal strength detecting method comprises receiving and converting a first signal to a second signal whose frequencies are lower than frequencies of the first signal, in a signal reception circuit of the communication system, receiving and converting the second signal to a third signal whose frequencies are higher than frequencies of the second signal when the communication system does not transmit any signal, in a signal transmission circuit of the communication system, detecting strength of the third signal and generating a signal strength indicator according to a detecting result corresponding to the strength of the third signal, wherein the signal strength indicator represents strength of the first signal received by a frequency down mixer of the signal transmission circuit.

The present invention discloses a signal strength detecting device of a communication system. The communication system comprises a signal reception circuit including a frequency down mixer and a signal transmission circuit including a frequency up mixer. The signal strength detecting device is coupled to the frequency down mixer for receiving and converting a first signal to a second signal whose frequencies are lower than frequencies of the first signal. The signal strength detecting device comprises a frequency up mixer for receiving and converting the second signal to a third signal whose frequencies are higher than frequencies of the second signal and a detecting unit for detecting strength of the third signal and generating a signal strength indicator to the communication system according a detecting result corresponding to the strength of the third signal, wherein the strength of the third signal represents strength of the first signal received by the frequency down mixer.

The present invention discloses the signal strength detecting device applicable for both time division multiple access (TDMA) and frequency division multiple access (FDMA)

reception system. When the TDMA system is adopted in the signal strength detecting device, the signal strength detecting device can perform the strength detection of the received signal without extra circuit by using existed circuit of the receiver and the transmitter.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
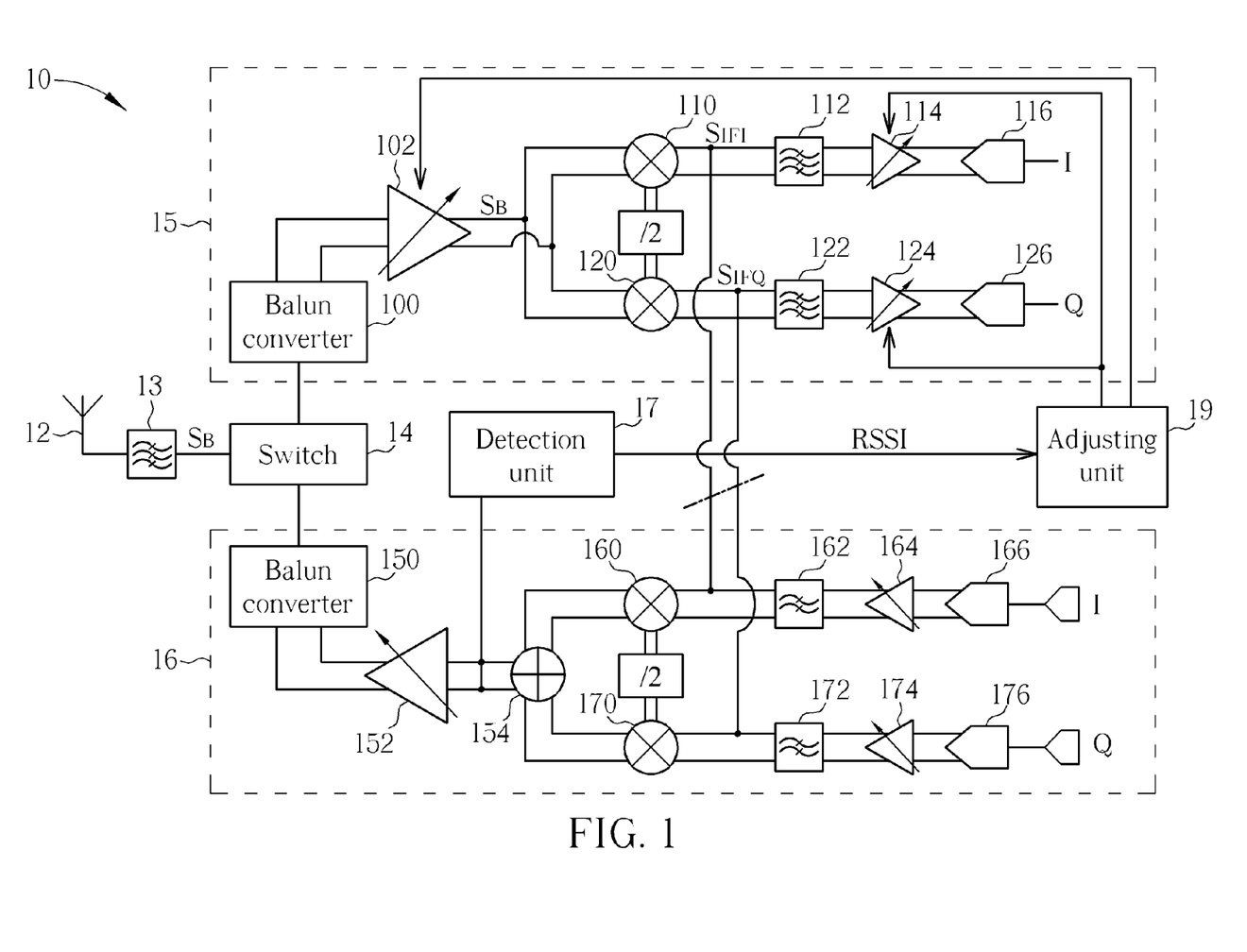
FIG. 1 is a schematic diagram of a RF transceiver according to an example.

Please refer to FIG. 1, which illustrates a schematic diagram of a radio frequency (RF) transceiver 10 adopting the concept of the signal strength detection according to an example of the present invention. The RF transceiver 10 comprises an antenna 12, a band pass filter 13, a switch 14, a receiver 15, a transmitter 16, a detection unit 17 and an adjusting unit 19 and is applicable for a time division duplex (TDD) communication system. The RF transceiver 10 utilizes the switch 14 to receive signals by the receiver 15 or transmit signals by the transmitter 16 to the antenna 12. The band pass filter 13 filters a band pass signal $S_B$ (the signal received by the RF transceiver 10) from radio signals captured by the antenna 12, wherein the central frequency of the received signal maybe the carrier frequency (central frequency) $f_c$ of the received signal. The receiver 15 comprises a Balun converter 100, a low noise amplifier (LNA) 102, a reception path of in-phase signals formed by a frequency mixer 110, an intermediate frequency filter 112, an intermediate frequency amplifier 114 and an analog to digital converter (ADC) 116 and a reception path of quadrature signals formed by a frequency mixer 120, an intermediate frequency filter 122, an intermediate frequency amplifier 124 and an ADC 126. The Balun converter 100, in short, is used to connect a balanced conducting wire at the receiver 15 side and an unbalanced coaxial cable at the antenna 12 side to reach impedance match between the receiver 15 and the antenna 12 sides and to increase the antenna bandwidth. The function of Balun 100 is a well-known in the art, so the detailed description is omitted herein. The LNA 102 is a variable gain amplifier (VGA) for adjusting the band pass signal $S_B$. In the reception path of in-phase signals (hereinafter in-phase path) of the receiver 15, the frequency mixers 110 and 120 are used as frequency down converter for converting the frequency of the band pass signal SB down to an intermediate frequency signal $S_{IF}$ (not shown in FIG. 1) divided into an in-phase intermediate frequency signal $S_{IFI}$ and a quadrature intermediate frequency signal $S_{IFQ}$. The frequency mixer 110 in the in-phase path is used for converting the frequency of band pass signal $S_B$ down to the baseband or near baseband frequency of the in-phase intermediate frequency signal $S_{IFI}$. After the in-phase intermediate frequency signal $S_{IFI}$ is filtered by the intermediate frequency filter 112 and the signal amplitude thereof is adjusted by the intermediate frequency amplifier 114, the ADC 116 converts the in-phase intermediate frequency signal $S_{IFI}$ to the digital signal and further the in-phase intermediate frequency signal $S_{IFI}$ is demodulated by a backend baseband circuit (not shown in FIG. 1). Since the operation of the quadrature signal path in the receiver 15 is similar with the abovementioned operation of the in-phase signal path, the related operation of the quadrature signal path is not given herein.

In addition, the transmitter 16 comprises a Balun converter 150, a power amplifier 152, an adder 154, a transmission path of in-phase signals formed by a frequency mixer 160, a low pass filter 162, a VGA 164 and an ADC 166, and a transmission path of quadrature signals formed by a frequency mixer 170, a low pass filter 172, a VGA 174 and an ADC 176. Since the operation principle of the transmitter 16 is the inverse operation of the receiver 15, please refer above mention for details.

The main concept of the present invention is to execute signal strength detection in the high frequency band, achieved by the operation of the RF transceiver 10 described below. The high frequency band can be regarded as the frequency band far from the base band, near the RF frequency.

The RF transceiver 10 can execute the auto gain control (AGC) for the received signal (e.g. $S_B$). The AGC adjusts amplifier gains of the receiver 15 according to the detecting signal strength so that the strength of the received signal can be well-situated when the received signal is received at the ADCs 116 and 126. In this situation, the ADCs 116 and 126 can correctly produce a digital received signal based on the received signal. In the RF transceiver 10, the strength detection utilizes the frequency mixers 110 and 120 in the receiver 15 to convert down the frequency of the band pass signal $S_B$, and then utilizes the frequency mixers 160 and 170 in the transmitter 16 to convert up the frequency of the band pass signal $S_B$ whose frequencies have been converted down. Finally, the detection unit 17 detects the strength of the in-phase baseband frequency signal $S_{IFI}$ and the quadrature baseband frequency signal $S_{IFQ}$ (i.e. a high frequency signal HFS), whose frequencies have been converted up. The frequency mixers 160 and 170 are used for frequency up converting of the strength detection when the transmitter 16 does not transmit signals. According to the strength detecting result, the detection unit 17 generates a signal strength indicator RSSI represented as the strength of the band pass signal $S_B$ received by the frequency mixers 110 and 120. The adjusting unit 19 has AGC function for adjusting gains of at least one of the LNA 102, and the intermediate frequency amplifiers 114 and 124 according to the signal strength indicator RSSI, so that the strength of the band pass signal $S_B$ received by frequency mixers 110 and 120 is adjusted.

Figure 2:
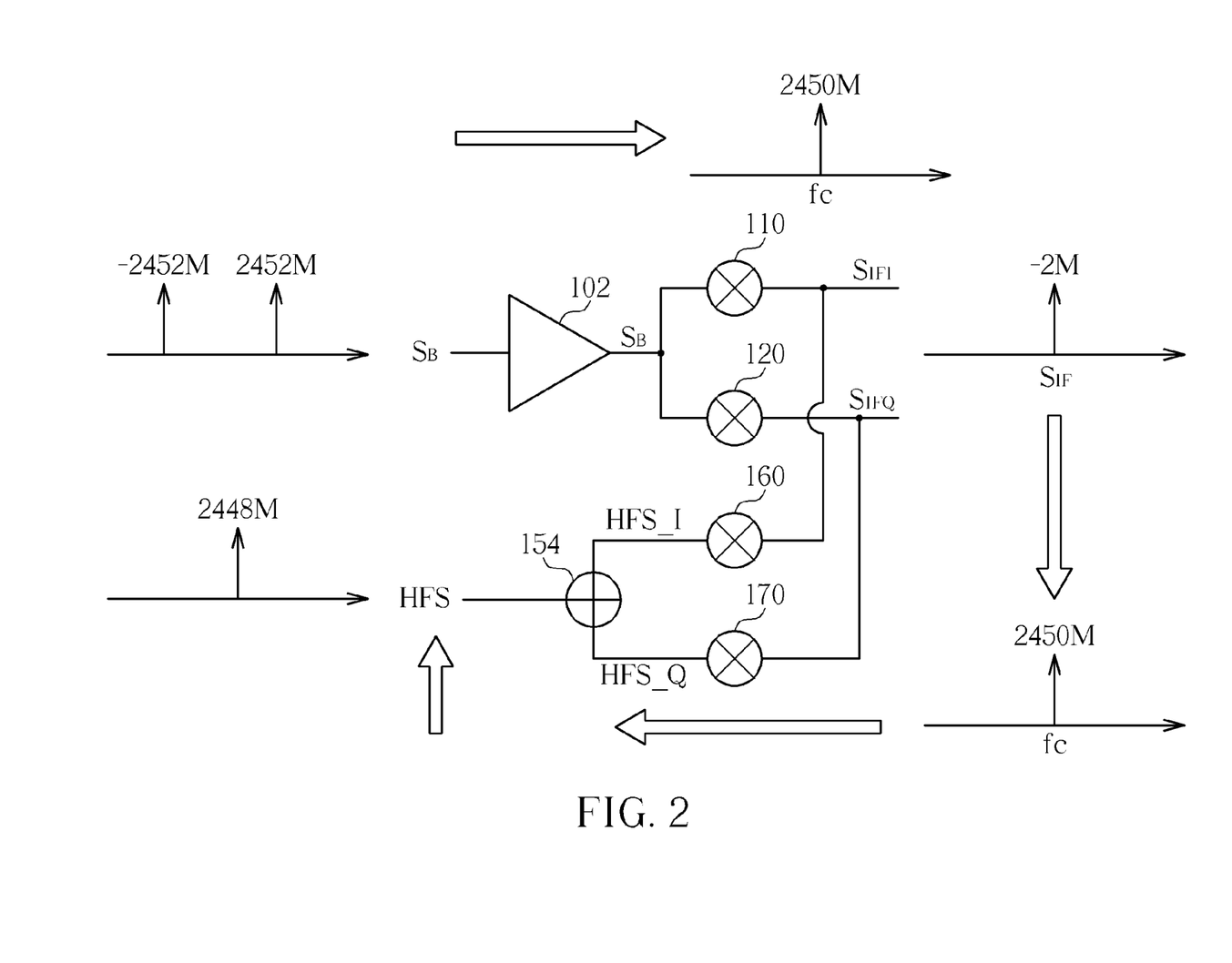
FIG. 2 is a schematic diagram of detecting signal strength according to an example.

In order to illustrate the concept of the present invention more in details, please refer FIG. 2, which illustrates a schematic diagram of detecting signal strength according to an example of the present invention. After the LNA 102 adjusts the amplitude of the band pass signal $S_B$, the frequency mixers 110 and 120 transform the band pass signal $S_B$ to the intermediate frequency signal $S_{IF}$ with lower frequency. The intermediate frequency signal $S_{IF}$ can be divided into an in-phase intermediate frequency signal $S_{IFI}$ and a quadrature intermediate frequency signal $S_{IFQ}$. The frequency of the band pass signal $S_B$ is usually higher far from the frequency of the intermediate frequency signal $S_{IF}$. More, the frequency mixers 110 and 120 can have the single-sideband modulation (SBB) function. Then, the frequency mixers 160 and 170 transform the in-phase intermediate frequency signal $S_{IFI}$ and the quadrature intermediate frequency signal $S_{IFQ}$ to an in-phase high frequency signal HFS_I and a quadrature high frequency signal HFS_Q. Finally the in-phase high frequency signal HFS_I is combined with the quadrature high frequency signal HFS_Q by the adder 154 to generate a high frequency signal HFS whose central frequency is near but different from the frequency of the band pass signal $S_B$. In other words, the frequency of the high frequency signal HFS is usually much higher than the frequency of the intermediate frequency signal $S_{IF}$. The detection unit 17 detects the strength of the high frequency signal HFS and thereby generates the signal strength indicator RSSI which is the base of the gain adjustment for an amplifier.

From the above, the RF transceiver 10 converts down and then up the frequency of the band pass signal $S_B$ to execute the strength detection of the band pass signal $S_B$ at the high frequency band. Hence, the settling time of the detected signals becomes shorter and the detected signal suffers weaker ripple effect. Besides, the RF transceiver 10 performs frequency down converting in the receiver 15 and frequency up converting in the transmitter 16. This shows that, in the TDMA system, an existed frequency down mixers of the receiver and a frequency up mixers of the transmitter can be employed to execute the signal strength detection. Hence, this circuit sharing mechanism between the receiver and the transmitter can eliminate use of extra frequency up mixers in the receiver to save the cost.

In addition, take an example based on FIG. 2. Assume that the frequency of the band pass signal $S_B$ is 2450 MHz and the frequency mixers 110 and 120 transform the band pass signal $S_B$ with a 2450 MHz central frequency $f_c$ (may be generated by the local oscillator not shown in FIG. 2) and filter out a 4902 MHz high frequency mirror signal via SBB to obtain a 2 MHz low frequency part which is the in-phase intermediate frequency signal $S_{IFI}$ and the quadrature intermediate frequency signal $S_{IFQ}$. Afterward, the frequency mixers 160 and 170 transform the in-phase intermediate frequency signal $S_{IFI}$ and the quadrature intermediate frequency signal $S_{IFQ}$ with the same central frequency $f_c$. Then, the adder 154 combines the in-phase intermediate frequency signal $S_{IFI}$ with the quadrature intermediate frequency signal $S_{IFQ}$ to generate a 2448 MHz high frequency signal HFS. Besides, as can be seen from above, by arranging frequencies used in the frequency mixers, the frequencies of the high frequency signal HFS and the band pass signal $S_B$ can be staggered, thereby avoiding affecting the received band pass signal $S_B$.

Figure 3:
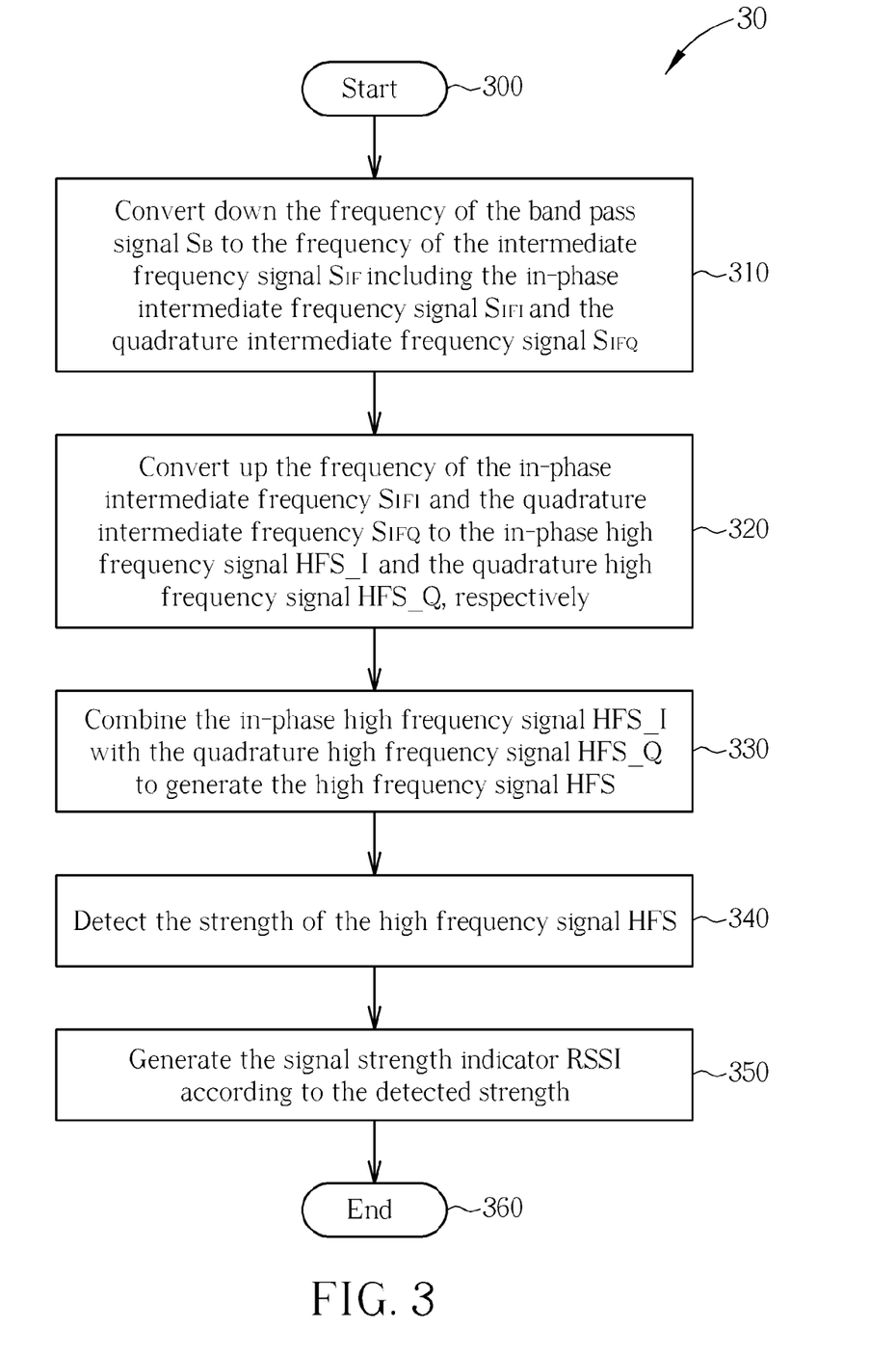
FIG. 3 is a flowchart of processes of the signal strength detection according to examples.

Please refer to FIG. 3, which is a flowchart of a signal strength detecting process 30 according to an example. The signal strength detecting process 30 maybe used for realizing the strength detection of the band pass signal $S_B$ in the RF transceiver 10 and includes the following steps:

Step 300: Start.

Step 310: Convert down the frequency of the band pass signal $S_B$ to the frequency of the intermediate frequency signal $S_{IF}$ including the in-phase intermediate frequency signal $S_{IFI}$ and the quadrature intermediate frequency signal $S_{IFQ}$.

Step 320: Convert up the frequency of the in-phase intermediate frequency $S_{IFI}$ and the quadrature intermediate frequency $S_{IFQ}$ to the in-phase high frequency signal HFS_I and the quadrature high frequency signal HFS_Q, respectively.

Step 330: Combine the in-phase high frequency signal HFS_I with the quadrature high frequency signal HFS_Q to generate the high frequency signal HFS.

Step 340: Detect the strength of the high frequency signal HFS.

Step 350: Generate the signal strength indicator RSSI according to the detected strength.

Step 360: End.

According to the signal strength detecting process 30, the frequency of band pass signal $S_B$ is converted down by the frequency mixers 110 and 120, and then converted up by the frequency mixers 160 and 170, so as to generate the high frequency signal HFS with the frequency near but different from the frequency of the band pass signal $S_B$. Finally, the corresponding signal strength indicator RSSI is generated according to the detected strength of the high frequency signal HFS. Thus, the strength of the band pass signal $S_B$ received by the frequency mixers 110 and 120 is adjusted to achieve the auto gain control of the receiver 15.

Figure 4:
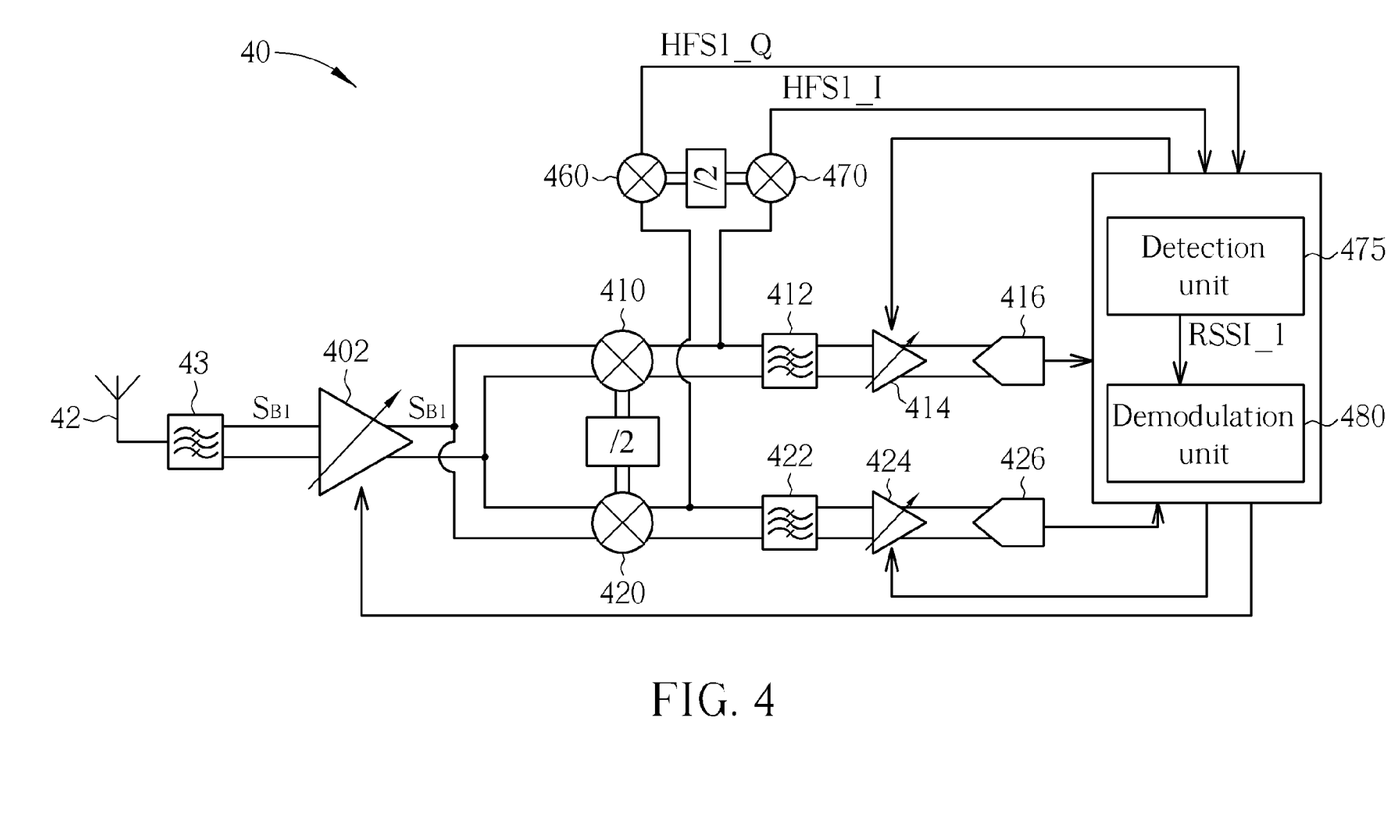
FIG. 4 is a schematic diagram of a receiver of the concept of the signal strength detection.

Please refer to FIG. 4, which illustrates a schematic diagram of a receiver 40 adopting the concept of the signal strength detection according to an example of the present invention. The receiver 40 is applicable for both the TDMA and FDMA systems and comprises an antenna 42, a band pass filter 43, a LNA 402, frequency up mixers 460 and 470, a detection unit 475, and a demodulation unit 480. In the receiver 40, a reception path of in-phase signals is formed by a frequency down mixer 410, an intermediate frequency filter 412, an intermediate frequency amplifier 414 and an ADC 416, and a reception path of quadrature signals is formed by a frequency down mixer 420, an intermediate frequency filter 422, an intermediate amplifier 424 and an ADC 426. In the receiver 40, after the antenna 42 receives radio signals, the radio signals are filtered by the band pass filter 43 to generate a band pass signal $S_{B1}$. The frequency of the band pass signal $S_{B1}$ is converted down by the frequency down mixers 410 and 420 and then converted up by the frequency up mixers 460 and 470 to generate a corresponding high frequency signal HFS1 (not shown in FIG. 4) whose in-phase part is HFS1_I and whose quadrature part is HFS1_Q. Finally, the strength of the high frequency signal HFS1 is detected by the detection unit 47. The abovementioned operation principle of frequency down and up converting is similar with the RF transceiver 10 in FIG. 1, and therefore, please refer former description for details and it is not given herein. The detection unit 475 is used to detect the peak voltage value of the signal whose frequencies are converted up by the frequency up mixers 460 and 470 and to generate a signal strength indicator RSSI_1 according to the detected peak voltage value. In addition, the demodulation unit 480 with the auto gain control function is used to adjust gains for at least one of the LNA 402, and the intermediate frequency amplifiers 414 and 424 according to the signal strength indicator RSSI_1. Therefore, the strength of the band pass signal $S_{B1}$ received at the frequency down mixers 410 and 420 can be adjusted continuously to avoid errors in the analog to digital transformation. From the above, an independent set of the frequency up mixers 460 and 470 is employed by the receiver 40, thereby allowing frequency down/up converting and SBB for the received signals can be executed in the receiver 40. Therefore, the receiver 40 is applicable for the TDMA or FDMA systems.

Figure 5:
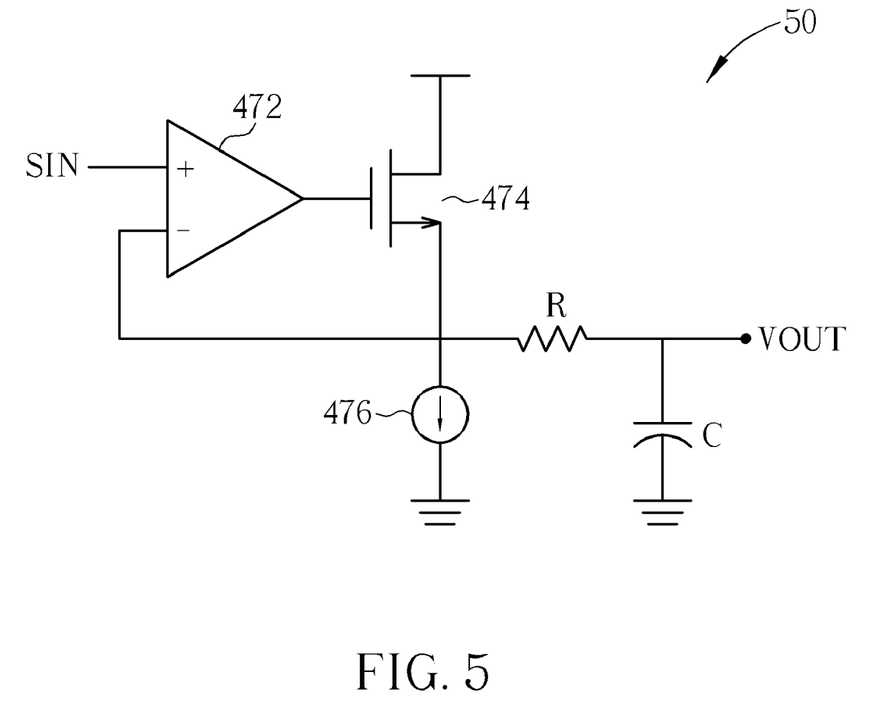
FIG. 5 is a schematic diagram of a peak value detecting device of the detection unit according to FIG. 4.

Please refer to FIG. 5, which illustrates a schematic diagram of a peak detecting circuit 50 for detecting the peak value for the detection unit 475 according to an example. The peak detecting circuit 50 comprises an operation amplifier 472, a transistor 474, a current source 476, a resistor R and a capacitor C and receives an input signal SIN by a ⌈+⌋ terminal of the operation amplifier 472, and the transistor 474 conducts and the capacitor C starts to be charged when the voltage on the ⌈+⌋ terminal is larger than the voltage on a ⌈−⌋ terminal of the operation amplifier 472 by over a threshold value. Afterwards, the voltage on the ⌈−⌋ terminal pulls high with voltage rising of an output voltage VOUT to turn off the transistor 474. After the transistor 474 is turned off, the capacitor C is discharged to lower the output voltage VOUT. When the voltage on the ⌈−⌋ terminal goes lower to a certain degree, the transistor 474 is conducted again. In order to execute the signal strength detection smoothly, the output voltage VOUT needs to be maintained at a peak value of the detected signal. In this situation, if the input signal SIN is a high frequency signal, the peak detecting circuit 50 can employ circuit with a smaller RC constant. On the contrary, if the input signal SIN is a low frequency signal, the peak detecting circuit 50 requires circuit with a larger RC constant. In the example of the present invention, the input signal SIN is the high frequency signal HFS1 in FIG. 4. Therefore, the peak detecting circuit 50 can employ capacitors with smaller capacitance and less area occupancy.

Figure 6:
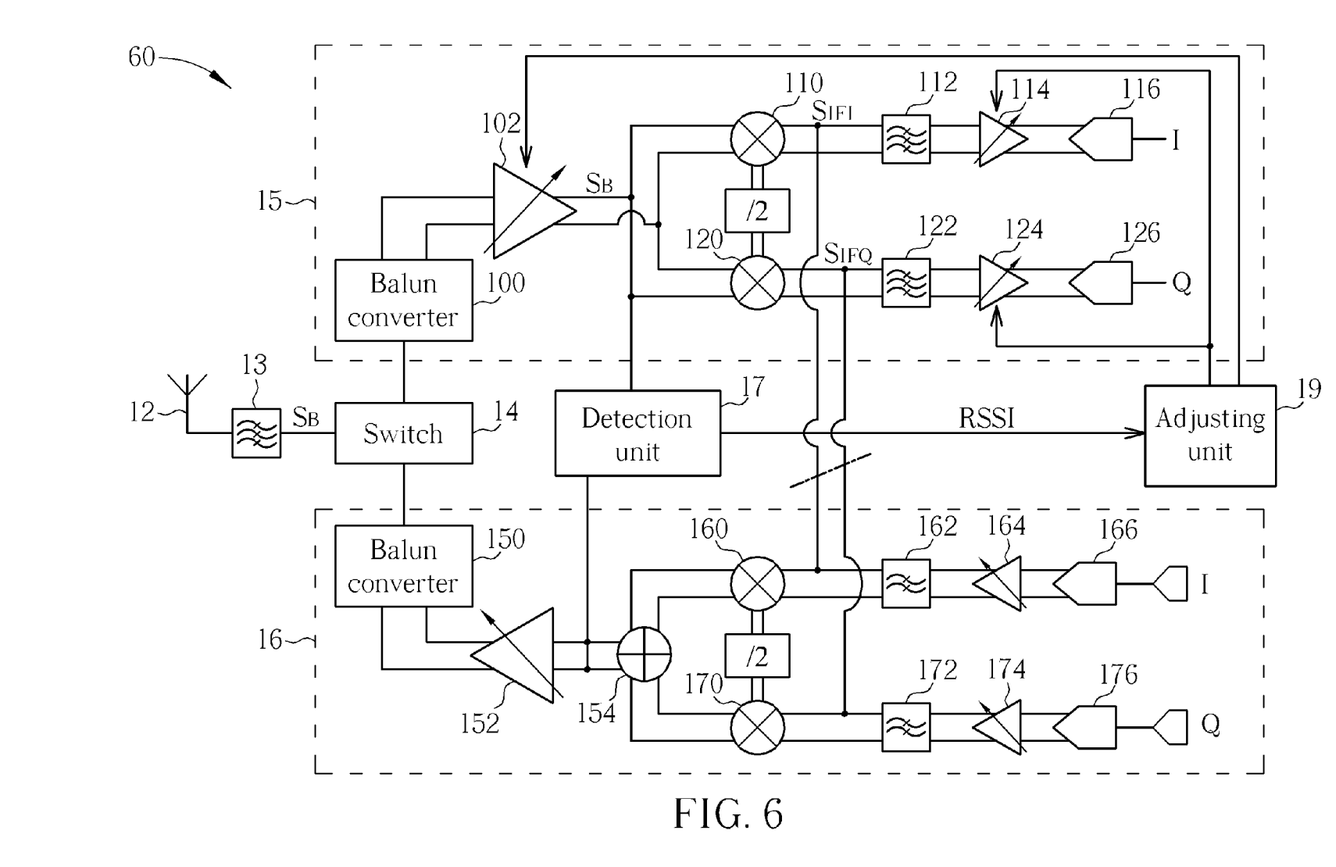
FIG. 6 is a schematic diagram of a RF transceiver according to an example.

Please refer to FIG. 6, which illustrates a schematic diagram of a RF transceiver 60 according to a second example. The RF transceiver 60 is made based on modification to the RF transceiver 10, and therefore, the same components in the RF transceiver 60 as the components in the RF transceiver 10 are marked with the same symbols. In the RF transceiver 60, in advance, the band pass signal SB is inputted to a detection unit 617 which has the same ability as the detection unit 17 in FIG. 1 and further can determine if the strength detection of the present invention and the follow-up amplifier gain adjustment has to be performed for the band pass signal SB, according to the detected strength of the band pass signal $S_B$. Steps of frequency down/up converting of the band pass signal $S_B$ can be executed when the detection unit 617 determines that the band pass signal $S_B$ causes error in A/D transformation of the ADCs 116 and 126.

Figure 7:
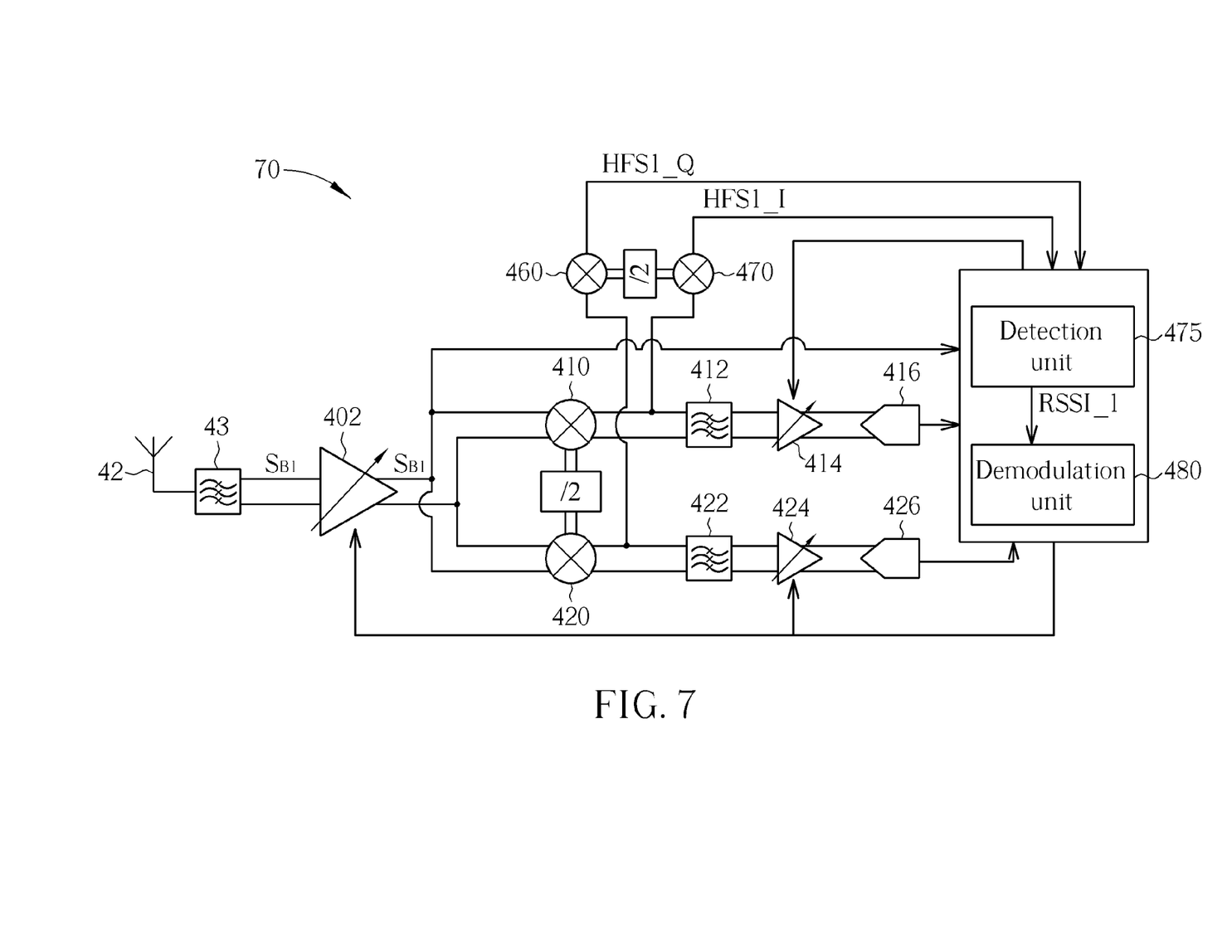
FIG. 7 is a schematic diagram of a receiver according to an example.

Similarly, please refer to FIG. 7, which illustrates a schematic diagram of a receiver 70 according to a second example. The receiver 70 is made based on modification to the receiver 40, and therefore, the same components in receiver 70 as the components in the receiver 40 are marked with the same symbols. In the receiver 70, in advance, the band pass signal $S_{B1}$ whose frequencies have not been converted down is inputted to a peak value detector (e.g. the peak value detector 470) of a detection unit 475 which sends a peak value detecting result to a demodulation unit 780. The demodulation unit 780 has the same ability as the demodulation unit 480 and further can determine if the strength detection of the present invention and the follow-up amplifier gain adjustment has to be performed for the band pass signal $S_B$, according to the peak value detecting result.

In conclusion, the present invention executes strength detection after converting the signal frequency up to a high frequency band to shorten signal stable time and weak ripple effect So that the efficiency and accuracy of the strength detection can be enhanced. The concept of the present invention is applicable for both the TDMA and FDMA systems. In the TDMA system, the concept of the present invention can employ existed frequency mixers of the receiver and the transmitter to convert up the frequency of the received signal whose frequencies have been converted down (e.g. the band pass signal SB whose frequencies have been converted down) during the time the transmitter does not transmit any signal. Moreover, the example of the present invention can avoid interference between the converted-up signals and the original received signals by appropriately choosing reference frequencies of the frequency mixers (e.g. the central frequency $f_c$) for frequency down/up converting. Besides, the signal strength detecting circuit (e.g. the peak value detector 470 in FIG. 5) can employ capacitors with smaller capacitance to reduce the occupied area.

Those skilled in the art will readily observe that numerous modifications and alterations of the device and method may be made while retaining the teachings of the invention.

What is claimed is:

1. A signal strength detecting device of a communication system, the signal strength detecting device coupled to a frequency down mixer of the communication system, the frequency down mixer used for receiving and converting a first signal to a second signal whose frequencies are lower than frequencies of the first signal, the signal strength detecting device comprising:
   a frequency up converter for receiving and converting the second signal to a third signal whose frequencies are higher than the frequencies of the second signal; and
   a detecting unit for detecting strength of the third signal and generating a signal strength indicator to the communication system according to a detecting result corresponding to the strength of the third signal, wherein the signal strength indicator represents the strength of the first signal received by the frequency down mixer.

2. The signal strength detecting device of claim 1, wherein the communication system comprises an auto gain control (AGC) circuit for adjusting the strength of the first signal received by the frequency down mixer according to the signal strength indicator.

3. The signal strength detecting device of claim 1, wherein the frequency down mixer converts the first signal to the second signal by a central frequency, and the frequency up mixer converts the second signal to the third signal by the central frequency, wherein the central frequency is a central frequency of a received signal corresponding to the first signal.

4. The signal strength detecting device of claim 1, wherein the frequency down mixer further executes single-sideband modulation (SBB) for the second signal, and the frequency up mixer further executes the SBB for the third signal.

5. The signal strength detecting device of claim 1, wherein the detecting unit comprises;
   an amplifier having a first input terminal for receiving the third signal, a second input terminal and an output terminal;
   a transistor having a gate coupled to the output terminal of the amplifier, a drain and a source coupled to the second input terminal;
   a current source coupled between a ground and the source of the transistor;
   a resistor having a first terminal coupled to the source of the transistor and a second terminal; and
   a capacitor having a first terminal coupled to the ground and a second terminal coupled to the second terminal of the resistor, the second terminal for outputting peak strength of the third signal.

6. A signal strength detecting method for a signal strength detecting device of a communication system, the signal strength detecting device coupled to a frequency down mixer for receiving and converting a first signal to a second signal whose frequencies are lower than frequencies of the first signal, the signal strength detection method comprises :
   receiving and converting the second signal to a third signal whose frequencies are higher than frequencies of the second signal;
   detecting strength of the third signal; and
   generating a signal strength indicator to the communication system according to a detecting result corresponding to the strength of the third signal, wherein the signal strength indicator represents strength of the first signal received by the frequency down mixer.

7. The signal strength detecting method of claim 6, wherein the communication system comprises an auto gain control (AGC) circuit for adjusting strength of the first signal received by the frequency down mixer according to the signal strength indicator.

8. The signal strength detecting method of claim 6, wherein the first signal is converted to the second signal according to a central frequency and receiving and converting the second signal to a third signal comprises receiving and then converting the second signal to the third signal by the central frequency, wherein the central frequency is a central frequency of a received signal corresponding to the first signal.

9. The signal strength detecting method of claim 6 further comprises executing single-sideband modulation (SBB) for the second signal and the third signal.

10. A communication system comprising:
 a signal reception circuit;
 a signal transmission circuit;
 a frequency down mixer installed in the signal transmission circuit, for receiving and converting a first signal to a second signal whose frequencies are lower than frequencies of the first signal;
 a frequency up mixer installed in the signal transmission circuit and coupled to the frequency down mixer, for receiving and converting the second signal to a third signal whose frequencies are higher than frequencies of the second signal when the communication system does not transmit any signal; and
 a detecting unit coupled to the frequency up mixer, for detecting strength of the third signal and generating a signal strength indicator according to a detecting result corresponding to the strength of the third signal, wherein the signal strength indicator represents a strength of the first signal received from the frequency down mixer.

11. The communication system of claim 10 further comprising an auto gain control (AGC) circuit coupled to the detecting unit and the frequency down mixer, for adjusting strength of the first signal received by the frequency down mixer according to the signal strength indicator.

12. The communication system of claim 10, wherein the frequency down mixer converts the first signal to the second signal by a central frequency and the frequency up mixer converts the second signal to the third signal by the central frequency, wherein the central frequency is a central frequency of a received signal corresponding to the first signal.

13. The communication system of claim 10, wherein the frequency down mixer further executes single-sideband modulation (SBB) for the second signal and the frequency up mixer further executes SBB for the third signal.

14. The communication system of claim 10, wherein the detecting unit comprises:
 an amplifier having a first input terminal for receiving the third signal, a second input terminal and an output terminal;
 a transistor having a gate coupled to the output terminal of the amplifier, a drain and a source coupled to the second input terminal;
 a current source coupled between a ground and the source of the transistor;
 a resistor having a first terminal coupled to the source of the transistor and a second terminal; and
 a capacitor having a first terminal coupled to the ground and a second terminal coupled to the second terminal of the resistor, the second terminal for outputting peak strength of the third signal.

15. A signal strength detecting method for a communication system, the signal strength detecting method comprises:
 receiving and converting a first signal to a second signal whose frequencies are lower than frequencies of the first signal, in a signal reception circuit of the communication system;
 receiving and converting the second signal to a third signal whose frequencies are higher than frequencies of the second signal when the communication system does not transmit any signal, in a signal transmission circuit of the communication system;
 detecting strength of the third signal; and
 generating a signal strength indicator according to a detecting result corresponding to the strength of the third signal, wherein the signal strength indicator represents strength of the first signal received by a frequency down mixer of the signal transmission circuit.

16. The signal strength detecting method of claim 15, wherein the communication system comprises an auto gain control (AGC) circuit for adjusting strength of the first signal received by the frequency down mixer according to the signal strength indicator.

17. The signal strength detecting method of claim 15, wherein receiving and converting the first signal to the second signal comprises converting the first signal to the second signal by a central frequency; and receiving and converting the second signal to the third signal comprises converting the second signal to the third signal by the central frequency, wherein the central frequency is a central frequency of a received signal corresponding to the first signal.

18. The signal strength detecting method of claim 15 further comprises:
 executing single-sideband modulation (SBB) for the second signal in the signal reception circuit; and
 executing SBB for the third signal in the signal transmission circuit.

19. A signal strength detecting device of a communication system comprising a signal reception circuit including a frequency down mixer and a signal transmission circuit including a frequency up mixer, the signal strength detecting device coupled to the frequency down mixer for receiving and converting a first signal to a second signal whose frequencies are lower than frequencies of the first signal, the signal strength detecting device comprising:
 a frequency up mixer for receiving and converting the second signal to a third signal whose frequencies are higher than frequencies of the second signal; and
 a detecting unit for detecting strength of the third signal and generating a signal strength indicator to the communication system according a detecting result corresponding to the strength of the third signal, wherein the strength of the third signal represents strength of the first signal received by the frequency down mixer.

20. The signal strength detecting device of claim 19, wherein the communication system has an auto gain control (AGC) mechanism and adjusts the strength of the first signal received by the frequency down mixer according to the signal strength indicator.

21. The signal strength detecting device of claim 19, wherein the frequency down mixer converts the first signal to the second signal by a central frequency and the frequency up mixer converts the second signal to the third signal by the central frequency, wherein the central frequency is a central frequency of a received signal corresponding to the first signal.

22. The signal strength detecting device of claim 19, wherein the frequency down mixer further executes single-sideband modulation (SBB) for the second signal and the frequency up mixer further executes SBB for the third signal.

* * * * *